United States Patent [19]
Konuma et al.

[11] Patent Number: 5,608,251
[45] Date of Patent: Mar. 4, 1997

[54] THIN FILM SEMICONDUCTOR INTEGRATED CIRCUIT AND METHOD OF FABRICATING THE SAME

[75] Inventors: Toshimitsu Konuma; Masaaki Hiroki; Hongyong Zhang; Mutsuo Yamamoto; Yasuhiko Takemura, all of Kanagawa, Japan

[73] Assignee: Semiconductor Energy Laboratory Co., Ltd., Kanagawa, Japan

[21] Appl. No.: 626,578

[22] Filed: Apr. 2, 1996

Related U.S. Application Data

[63] Continuation of Ser. No. 322,165, Oct. 13, 1994, abandoned.

[30] Foreign Application Priority Data

Oct. 20, 1993 [JP] Japan .................................. 5-285990

[51] Int. Cl.$^6$ .......................... H01L 29/76; H01L 27/01; H01L 27/13
[52] U.S. Cl. ......................... 257/337; 257/344; 257/410; 257/59
[58] Field of Search ............................... 257/59, 72, 410, 257/351, 391, 392, 393, 344, 336, 337; 359/54, 59, 87

[56] References Cited

U.S. PATENT DOCUMENTS

| | | | |
|---|---|---|---|
| 5,308,998 | 5/1994 | Yamazaki | 257/410 |
| 5,323,042 | 6/1994 | Matsumoto | 257/72 |
| 5,341,012 | 8/1994 | Misawa et al. | 257/351 |
| 5,412,493 | 5/1995 | Kunii et al. | 359/59 |

*Primary Examiner*—Donald L. Monin, Jr.
*Attorney, Agent, or Firm*—Sixbey, Friedman, Leedom & Ferguson, P.C.; Gerald J. Ferguson, Jr.

[57] ABSTRACT

In a semiconductor integrated circuit, a plurality of thin film transistors (TFTs) are formed on the same substrate having an insulating surface. Since gate electrodes formed in the TFTs are electrically insulated each other, voltages are applied independently to gate electrodes in an electrolytic solution during an anodization, to form an anodic oxide in at least both sides of each gate electrode. A thickness of the anodic oxide is changed in accordance with characteristics of the TFT. A width of high resistance regions formed in an active layer of each TFT is changed by ion doping using the anodic oxide having a desired thickness as a mask.

17 Claims, 6 Drawing Sheets

THIN FILM SEMICONDUCTOR INTEGRATED CIRCUIT AND METHOD OF FABRICATING THE SAME

This application is a Continuation of Ser. No. 08/322, 165, filed Oct. 13, 1994, now abandoned.

BACKGROUND OF THE INVENTION

1. Field of the Invention

The present invention relates to a thin film shaped integrated circuit comprising a plurality of thin film insulated gate semiconductor devices such as thin film transistors (TFTs) formed on an insulating surface, and to a method of fabricating the integrated circuit. Semiconductor devices according to the invention can be used in active matrix circuits of electro-optical devices such as liquid crystal displays, in driver circuits for image sensors, in SOI integrated circuits, and in conventional semiconductor integrated circuits (e.g., microprocessors, microcontrollers, microcomputers, semiconductor memories, and so on). More particularly, the invention relates to a monolithic thin film integrated circuit comprising an active matrix circuit and drivers for driving the circuit are formed on the same substrate or memories and a CPU are formed on the same substrate and to a method of fabricating the monolithic thin film integrated circuit.

2. Description of the Related Art

In recent years, researches on a method of fabricating an insulated gate semiconductor device (MISFET) either on an insulating substrate or an insulating surface has been conducted. The insulating surface is insulated from the semiconductor substrate by a thick insulating film. A semiconductor device in which a semiconductor layer (active layer) has the form of a thin film is called a thin film transistor (TFT). It is difficult to obtain good crystallinity corresponding to the crystallinity of a single crystal semiconductor. Therefore, a non-single crystal semiconductor is commonly used.

Such a non-single crystal semiconductor is inferior in characteristics to a single crystal semiconductor. Especially, when a reverse voltage (a negative voltage in the case of an N-channel TFT and a positive voltage in the case of a P-channel TFT) is applied to the gate electrode, the leakage current between the source and drain increases and the mobility of the TFT reduces. Therefore, it is necessary to form an intrinsic or weak P- or N-type high resistance region between the source/drain regions and the gate electrode.

For example, where high resistance regions are formed, at least the side surfaces of a gate insulating film are oxidized by anodization or other method, and doping is done by a self-alignment utilizing the oxide or its trace. In this way, high resistance regions having a uniform width can be obtained.

However, such a high resistance region acts also as a resistor inserted in series between the source and drain. Therefore, where TFTs having different characteristics are formed on the same insulating surface, problems produce. Where high speed operation is needed, these regions are not necessary. For a monolithic circuit comprising the same substrate on which an active matrix circuit and drivers for driving the active matrix circuit are formed, the active matrix circuit has preferably low leakage current. Consequently, TFTs having wide high resistance regions are desired. On the other hand, the drivers are required to operate at high speeds. In consequence, TFTs having narrow high resistance regions are desired. However, high resistance regions of TFTs formed on the same substrate by the same process have a uniform width and so it is difficult to modify the widths of the high resistance regions according to the need. Furthermore, it is difficult to fabricate monolithic active matrix circuits and monolithic integrated circuits.

SUMMARY OF THE INVENTION

The object of the present invention is to solve the above problems.

According to the present invention, there is provided a semiconductor integrated circuit comprising a substrate, an active matrix circuit which is formed on the substrate and includes a plurality of thin film transistors each having first high resistance regions, and driving means for driving the active matrix circuit which is formed on the substrate and includes at least another one thin film transistor having second high resistance regions, wherein a width of the first high resistance regions is larger than that of the second high resistance regions.

According to the present invention, there is provided a semiconductor integrated circuit comprising a substrate, at least one thin film transistor which is formed on the substrate and has first high resistance regions, and at least another one thin film transistor which is formed on the substrate and has second high resistance regions, wherein a width of the first high resistance regions is larger than that of the second high resistance regions.

According to the present invention, there is provided a semiconductor device comprising, a substrate having an insulating surface, a plurality of semiconductor regions which are formed on the insulating surface and each have at least one active layer, an insulating film covering the semiconductor regions, a gate electrode formed on each active layer through the insulating film, and at least one anodic oxide formed in at least both sides of each gate electrode, wherein a thickness of one anodic oxide formed in one gate electrode is different from that of another anodic oxide formed in another gate electrode.

According to the present invention, there is provided a semiconductor device comprising, a substrate having an insulating surface, a plurality of semiconductor regions which are formed on the insulating surface and each have at least one active layer, an insulating film covering the semiconductor regions, a gate electrode formed on each active layer through the insulating film, and at least one anodic oxide formed in at least both sides of each gate electrode, wherein a thickness of one anodic oxide formed in one gate electrode is different from that of another anodic oxide formed in another gate electrode.

According to the present invention, there is provided a method for producing a semiconductor device comprising the steps of: forming a plurality of semiconductor regions on an insulating surface; forming an insulating film on the semiconductor regions; forming at least one gate electrode on each semiconductor region through the insulating film, wherein at least two gate electrodes are electrically insulated each other; and forming at least one anodic oxide in at least both sides of each gate electrode by applying voltages to each gate electrode in an electrolytic solution, wherein a voltage applying time to one gate electrode is different from that to another gate electrode.

According to the present invention, there is provided a method for producing a semiconductor device comprising the steps of: forming a plurality of semiconductor regions each having at least one active layer on an insulating surface; forming an insulating film on the semiconductor regions; forming a gate electrode on each active layer through the insulating film; forming at least one anodic oxide in at least both sides of each gate electrode; and introducing impurity into each active layer using each gate electrode and each anodic oxide as masks, to form high resistance regions in each active layer.

According to the present invention, there is provided a method for producing a semiconductor integrated circuit comprising the steps of: forming on a substrate an active matrix circuit including a plurality of thin film transistors each having first high resistance regions; and forming on the substrate a driver for driving the active matrix circuit, the driver including at least another one thin film transistor having second high resistance regions, wherein a width of the first high resistance regions is larger than that of the second high resistance regions.

According to the present invention, there is provided a method for producing a semiconductor integrated circuit comprising the steps of: forming on a substrate at least one thin film transistor having first high resistance regions; and forming on the substrate at least another one thin film transistor having second high resistance regions, wherein a width of the first high resistance regions is larger than that of the second high resistance regions.

According to the present invention, there is provided a method for producing a semiconductor device comprising the steps of: forming a plurality of semiconductor regions each having at least one active layer on an insulating surface; forming an insulating film on the semiconductor regions; forming a gate electrode on each active layer through the insulating film; and forming at least one anodic oxide in at least both sides of each gate electrode, wherein a thickness of one anodic oxide formed in one gate electrode is different from that of another anodic oxide formed in another gate electrode.

According to the present invention, there is provided a method for producing a semiconductor device comprising the steps of: forming a plurality of semiconductor regions each having at least one active layer on an insulating surface; forming an insulating film on the semiconductor regions; forming a gate electrode on each active layer through the insulating film; forming at least one anodic oxide in each gate electrode, wherein a thickness of one anodic oxide formed in one gate electrode is different from that of another anodic oxide formed in another gate electrode; and introducing impurity into each active layer using each gate electrode and each anodic oxide as masks, to form high resistance regions in each active layer.

According to the present invention, there is provided a method for producing a semiconductor integrated circuit comprising the steps of: forming on an insulating surface at least one thin film transistor including high resistance regions having one of at least two different widths; and forming on the insulating surface at least another one thin film transistor including high resistance regions having another one of at least two different widths.

DETAILED DESCRIPTION OF THE PREFERRED EMBODIMENTS

Figure 1A:
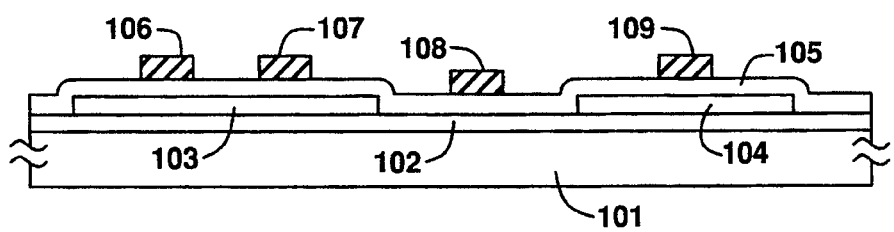
FIGS. 1A to 1E are cross-sectional views of a TFT circuit according to Example 1 of the present invention.

The present invention provides a semiconductor integrated circuit in which the widths of high resistance regions are modified according to required characteristics and reliability of TFTs and circuits, and a method of fabricating such a semiconductor integrated circuit.

The anodization time is changed according to TFTs in an anodization process, whereby the widths of high resistance regions are changed. In a monolithic active matrix circuit, the high resistance regions of TFTs forming the active matrix circuit for low off current/low frequency operation are wider than the high resistance regions of TFTs forming a driver for large current/high frequency operation and than the high resistance regions of TFTs forming a decoder for low power consumption/high frequency operation. Furthermore, the high resistance regions of N-channel TFTs (NTFTs) are wider than those of P-channel TFTs (PTFTs).

The high resistance regions of TFTs forming a monolithic active matrix circuit have widths of 0.4 to 1 µm. The high resistance regions of NTFTs forming a driver have widths of 0.2 to 0.3 µm.

The high resistance regions of PTFTs have widths of 0 to 0.2 µm. NTFTs forming a decoder used for a CPU or other logic operation device/circuit have widths of 0.3 to 0.4 µm. PTFTs used in similar applications have widths of 0 to 0.2 µm. In this example, the high resistance regions of TFTs forming an active matrix circuit are wider than those of TFTs forming drivers and decoders. The high resistance regions of NTFTs are wider than those of PTFTs.

The high resistance regions of TFTs forming an active matrix circuit are wider than those of TFTs forming drivers and decoders, because the active matrix circuit is required to exhibit low leakage current, while the drivers and decoders are required to accomplish high speed operation. In the drivers and decoders, the width of high resistance region is changed between NTFT and PTFT for the following reason. If a weak N-type high resistance region is formed in an NTFT, the electric field around the drain is reduced. This suppresses deterioration due to hot carriers. For PTFTs, the degree of deterioration due to hot carriers is smaller and so it is not necessary to form a high resistance region. Rather, the existence of a high resistance region lowers the operation speed of the TFTs. Since PTFTs have mobilities smaller than those of NTFTs, it is desired to narrow the high resistance regions of the PTFTs. Hence, the high resistance regions of NTFTs are wider than those of PTFTs.

EXAMPLE 1

Processes for fabricating an integrated circuit having different types of TFTs are illustrated in FIGS. 1A to 1E, and 2A to 3C. Cross sections indicated by the alternate long and short dash lines in FIGS. 2A to 2C correspond to FIGS. 1A, 1C, and 1E, respectively. A substrate 101 made of Corning 7059 is 300×300 mm or 100×100 mm in size. A silicon oxide film 102 having a thickness of 1000 to 3000 Å is formed on the substrate 101 by sputtering or plasma CVD (PCVD).

An amorphous silicon film is deposited at a thickness of 300 to 1500 Å, preferably 500 to 1000 Å, by PCVD or low pressure CVD (LPCVD). The amorphous silicon film is patterned to form island-like silicon regions 103 and 104. A silicon oxide film having a thickness of 200 to 1500 Å, preferably 500 to 1000 Å, is formed by sputtering or PCVD. The silicon oxide film acts also as a gate insulating film. Where PCVD is used, RF discharge is produced using oxygen and a raw material gas including TEOS at a substrate temperature of 150° to 400° C., preferably 200° to 250° C. The TEOS is decomposed and deposited. A ratio of a pressure of TEOS to a pressure of oxygen is 1:1 to 1:3. The pressure is 0.05 to 0.5 torr. The RF power is 100 to 250 W. TEOS can be deposited by LPCVD or atmospheric pressure CVD using TEOS and ozone gas at a substrate temperature of 150° to 400° C., preferably 200° to 250° C.

A KrF excimer laser having a wavelength of 248 nm and a pulse width of 20 ns is irradiated to crystallize the silicon region 103.

The energy density is 200 to 400 mJ/cm$^2$, preferably 250 to 300 mJ/cm$^2$. During the laser irradiation, the substrate is heated at 300° to 500° C. An XeCl excimer laser having a wavelength of 308 nm or other laser may also be used as the aforementioned laser. The region 104 remains amorphous.

Figure 2A:
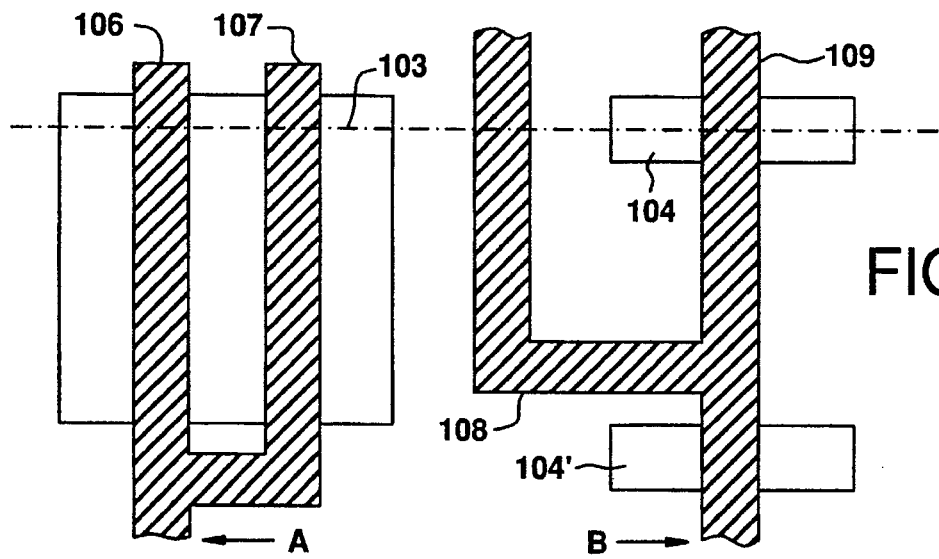
FIGS. 2A to 2C are top views of a TFT circuit according to Example 1

Subsequently, an aluminum film having a thickness of 2000 Å to 5 μm, e.g., 6000 Å, is formed by electron beam evaporation. This film is patterned to form gate electrodes 106, 107 and 109 and an interconnect (wiring) 108. If the aluminum film is doped with 0.05 to 0.3% of scandium (Sc) by weight, then generation of hillocks due to heating is suppressed. In FIG. 2A, the gate electrode 109 and the interconnect 108 are electrically interconnected each other. The gate electrodes 106 and 107 (referred to herein as the series A) are electrically insulated from the gate electrode 109 and the interconnect 108 (referred to herein as the series B).

Then, the laminated substrate is immersed in an ethylene glycol solution of 1 to 3% tartaric acid. The pH of the solution is approximately 7. Anodization is effected using platinum as a cathode and the gate electrode as an anode. The anodic oxide obtained by using such neutral solution is known as the barrier type. This oxide is dense and has excellent voltage resistance characteristics.

Figure 1B:
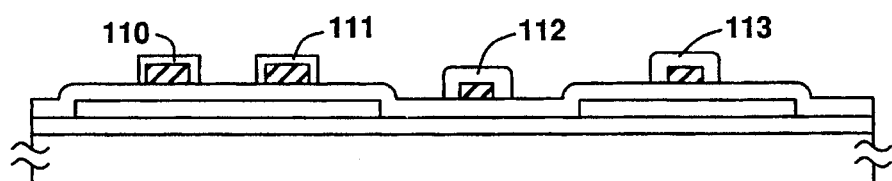

Two voltage sources are used to adjust the voltages independently during the anodization. The voltage sources are connected with series A and B, respectively. First, a voltage is applied to both series A and B at 2 to 5 V/min up to a voltage $V_1$ of 50 to 150 V (100 V in this example). Then, the voltage $V_1$ is kept applied for 1 hour. Thereafter, the voltage applied to the series A is kept at $V_1$, while the voltage applied to the series B is further increased at 2 to 5 V/min up to a voltage $V_2$ ($V_1 < V_2$) of 100 to 250 V (200 V in this example). Because of two stage anodization processes, a thickness of the anodic oxide formed on top and side surfaces of the gate electrode in series A differs from that in series B. The thickness of the latter anodic oxide is larger. As a result, anodic oxides 110 and 111 having a thickness of about 1200 Å is formed in the gate electrodes 106 and 107. Anodic oxides 112 and 113 having a thickness of 2400 Å is formed in the gate electrode 109 and the interconnect 108 (FIG. 1B).

Then, impurity ions such as phosphorus and boron are introduced into the island silicon film of TFTs by ion doping (plasma doping) utilizing CMOS technology or self-alignment impurity introduction technology. Phosphine ($PH_3$) and diborane ($B_2H_6$) are used as dopant gases. The dose is $2\times10^{15}$ to $8\times10^{15}$ cm$^{-2}$. As a result, N-type impurity (phosphorus) regions 114, 116 and a P-type impurity (boron) region 115 are formed.

Figure 1C:
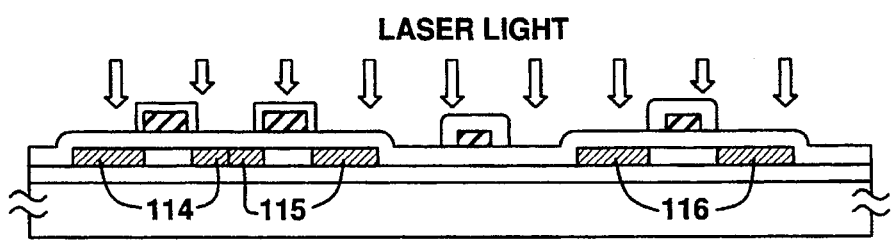
Figure 2B:
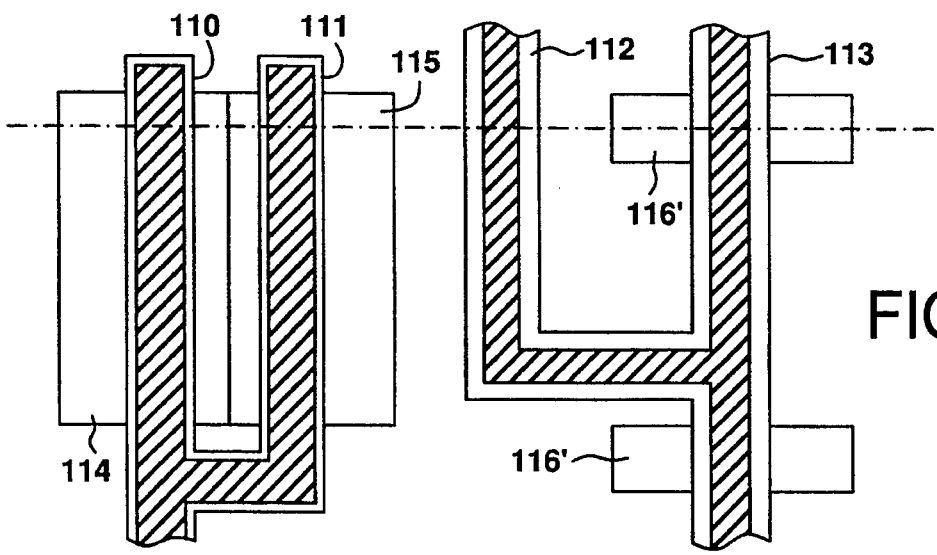

A KrF excimer laser is irradiated to activate the regions 114, 115 and 116. The laser has a wavelength of 248 nm, a pulse width of 20 ns, and an energy density of 150 to 400 mJ/cm$^2$, preferably 200 to 250 mJ/cm$^2$. Thus, the crystallinity of the deteriorated portions is improved by the introduction of the impurities. The sheet resistance of these regions is 200 to 800 Ω/square. The present process can be carried out by RTA (rapid thermal anneal) (FIGS. 1C and 2B).

The width of the offset region (high resistance region) of each TFT is determined by the above process. The anodic oxides 110 and 111 of the TFTs 126 and 127 have a thickness of about 1200 Å. Taking account of non-straight movement of dopant ions during ion doping, the offset widths $x_1$ and $x_3$ are about 1000 Å. The thickness of the anodic oxide 113 of the TFT 128 is about 2400 Å. Therefore, the offset width $x_2$ is about 2000 Å.

It is necessary that the offset widths $x_1$ and $x_3$ of the TFTs 126 and 127 be smaller than the offset width $x_2$ of the TFT 128 which is required to have a low off current. However, the offset width of the NTFT is greater than that of the PTFT ($x_3 > x_1$) because the NTFT is readily deteriorated by hot carriers produced by the reverse bias applied to the drain. The TFT 128 which an off current is small and to which a high drain voltage is applied has a large offset width ($x_2 > x_3$).

Figure 1D:
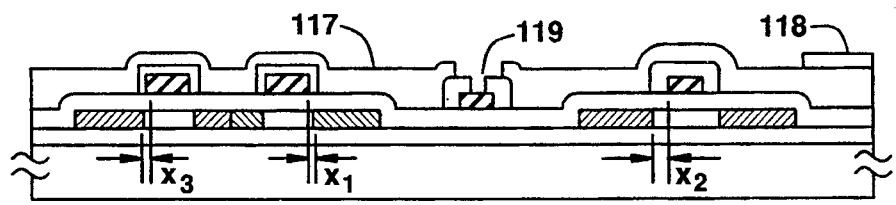

Subsequently, the gate electrode and the interconnects are cut off. Silicon oxide is formed as an interlayer insulator 117 at a thickness of 3000 to 10000 Å (e.g., 6000 Å), at a substrate temperature of 150° to 400° C., preferably 200° to 300° C., by PCVD using TEOS (raw material gas) and oxygen, or by LPCVD or atmospheric pressure CVD using TEOS and ozone. At this time, if fluorine is reacted by dicarbon hexafluoride ($C_2H_6$) and added to the silicon oxide, then the step coverage can be improved. An ITO film is deposited by sputtering and patterned to form a pixel electrode 118. The interlayer insulator 117 and the anodic oxide 112 on the interconnect 108 are etched to form contact holes 119 (FIG. 1D).

Figure 2C:
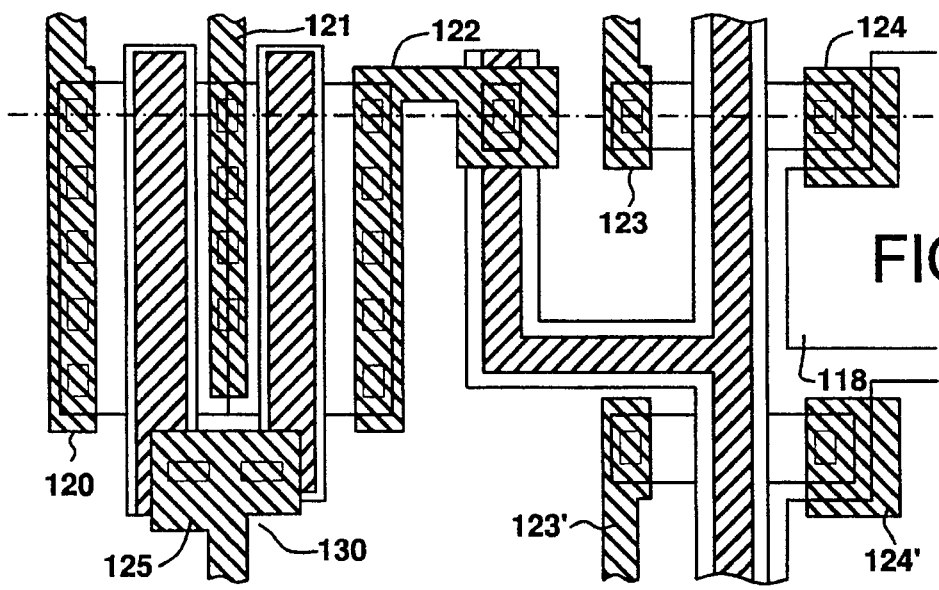

The interlayer insulator 117 and the gate insulating film 105 are etched to form contact holes in the source and drain. At the same time, the anodic oxides 110 and 111 are etched to create contact holes in the gate electrodes 106 and 107 (FIG. 2C).

Figure 1E:
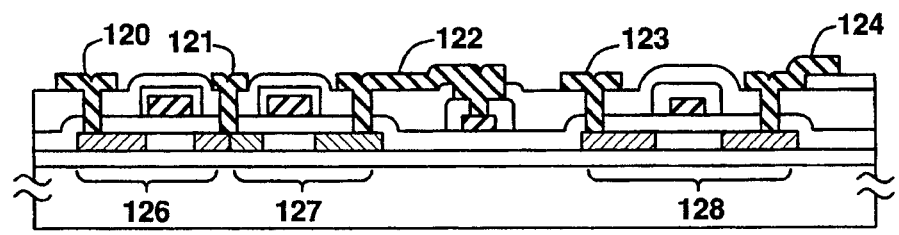

After forming multilayer interconnects 120 to 125 having titanium nitride and aluminum, the interconnect 124 is connected with the pixel electrode 118. The interconnect 125 is connected with the gate electrodes 106 and 107 via the formed contact holes. The laminate substrate is annealed within hydrogen at 200° to 300° C. for 0.1 to 2 hours, thus completing hydrogenation of the silicon. In this way, an integrated circuit is completed (FIGS. 1E and 2C).

In the present example, the process for forming the contact holes by etching the anodic oxide 113 is carried out independent of the process for forming the other contact holes. These processes may be effected simultaneously. In the present example, these two kinds of contact holes are formed separately for the following reason. The thickness of the anodic oxide 113 is larger than that of the anodic oxides 110 and 111 by 1200 Å. The etch rate of the barrier type anodic oxide is much less than the etch rate of silicon oxide or the like. If they are simultaneously etched, the contact holes in the source and drain covered with the silicon oxide film that is readily etched are etched excessively. As a result, the holes go into the source and drain.

In this way, since different types of TFTs are formed on the same substrate. The active layers of the TFTs 126 and 127 are made from crystalline silicon and have narrow high resistance region (offset regions), these TFTs are suitable for high speed operation. Since the active layer of the TFT 128 is made from amorphous silicon and has a wide high resistance region, this TFT can be used as a TFT having a low leakage current. If the active layer of the TFT 128 is made from crystalline silicon having a lower degree of crystallinity than the TFTs 126 and 127, the same advantages can be obtained. If a monolithic active matrix circuit is fabricated by the same process, the former TFT may be used to form a driver. The latter TFT may be used for an active matrix circuit.

NTFTs often experience deterioration due to hot carriers. However, such deterioration is rarely observed with driver TFTs having wide channels (having an offset width of $x_4$). NTFTs (having an offset width of $x_3$) used for decoders which are required to operate at high frequencies, especially, shift registers, CPUs, memories, and other circuits, must have small channel widths and small channel lengths. Therefore, in these NTFTs, a drain voltage is lower and deterioration is smaller than the TFT 128 (having an offset width of $x_2$) of the active matrix circuit. Consequently, the relation $x_4 < x_3 < x_2$ must be satisfied. Since PTFTs used as driver TFTs and other circuits hardly deteriorate, for these PTFTs having an offset region width of $x_1$, the relation is $x_1 \leq x_4$.

EXAMPLE 2

The present example is illustrated in FIGS. 3A to 3F, and 4A to 4C. FIGS. 3A to F are cross sections of portions indicated by the alternate long and short dash lines in FIGS. 4A to 4C. A substrate 201 is made of Corning 7059 and is 300×400 mm or 100×100 mm in size. Silicon oxide is deposited as a base oxide film 202 on the substrate 201 at a thickness of 1000 to 3000 Å, e.g., 2000 Å, by sputtering in an oxygen atmosphere. To enhance the mass productivity, a film which is formed by decomposing and depositing TEOS by PCVD may also be used.

Then, an amorphous silicon film having a thickness of 300 to 5000 Å, preferably 500 to 1000 Å, is formed by PCVD or LPCVD. The laminated substrate is allowed to stand at 550° to 600° C. in a reducing atmosphere for 24 hours to crystallize the amorphous silicon film. This process may also be effected using laser irradiation. The crystallized silicon film is patterned to form island active layer regions 203 and 204. Furthermore, a silicon oxide film 205 having a thickness of 700 to 1500 Å is formed by sputtering.

Figure 3A:
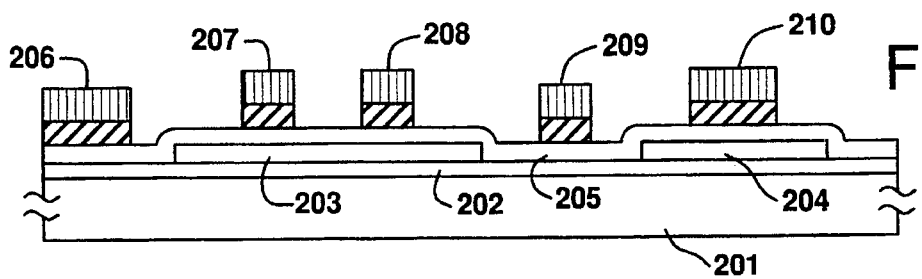
FIGS. 3A to 3F are cross-sectional views of a TFT circuit according to Example 2 of the present invention.

An aluminum film having a thickness of 1000 Å to 3 µm, e.g., 6000 Å, is formed by electron beam evaporation or sputtering. The aluminum film contains either 1% of Si by weight or 0.1 to 0.3% of scandium (Sc) by weight. A photoresist film such as OFPR 800/30cp manufactured by Tokyo Ohka Co., Ltd. is formed by spin coating. If an aluminum oxide film having a thickness of 100 to 1000 Å is formed by anodization before the formation of the photoresist film, the adhesion to the photoresist film is improved. Also, leakage of electrical current from the photoresist can be suppressed. Therefore, this aluminum oxide film is effective where a porous anodic oxide is formed in a later anodization process. After patterning and etching the photoresist film and the aluminum film, interconnects 206 and 209 and gate electrodes 207, 208 and 210 are formed (FIG. 3A).

Figure 4A:
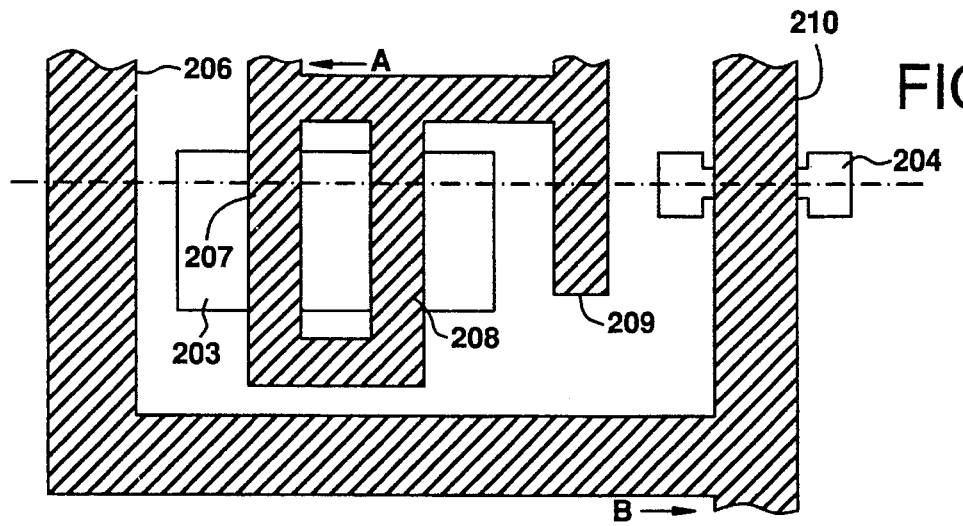
FIGS. 4A to 4C are top views of a TFT circuit according to Example 2.

The photoresist film on the interconnects and on the gate electrodes acts as a mask for preventing anodization. The gate electrodes 207 and 208 and the interconnect 209 (referred to as the series A2) is electrically insulated from the interconnect 206 and the gate electrode 210 (referred to as the series B2) (FIG. 4A).

Figure 3B:
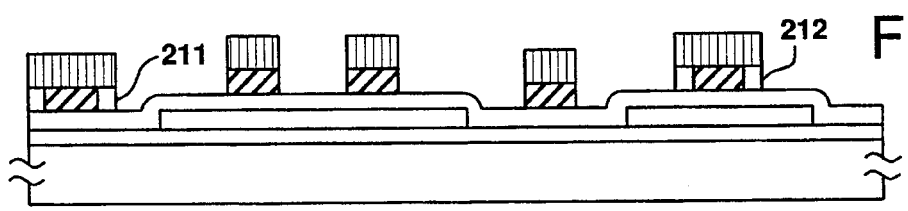
Figure 4B:
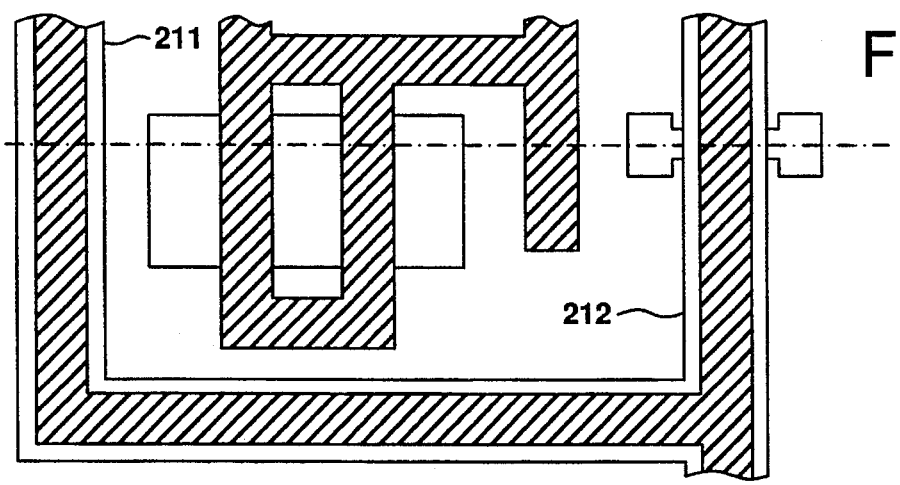

Only the series B2 is anodized in an electrolytic solution for 20 to 240 minutes by applying 5 to 30 V (8 V in this example). The electrolytic solution is 3 to 20% acidic aqueous solution of citric acid, oxalic acid, phosphoric acid, chromic acid, or sulfuric acid, in this example, a solution of oxalic acid (30° to 80° C.). Porous anodic oxides 211 and 212 having a thickness of 3000Å to 25 µm, e.g., 0.5 µm, is formed in the side surfaces of the interconnects and the gate electrodes. The thickness of the anodic oxide is adjusted by the anodization time and the temperature. Since the series A2 is not anodized, anodic oxide is not formed in the gate electrodes 207 and 208 and interconnect 209 (FIGS. 3B and 4B).

Figure 3C:
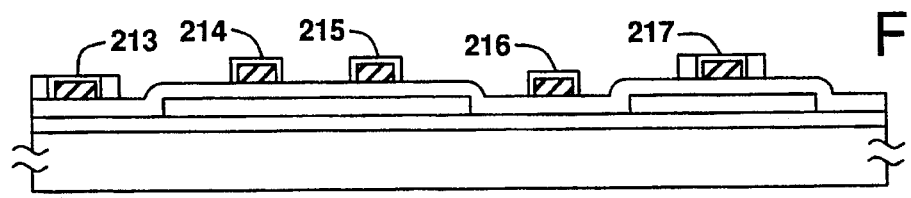
Figure 3D:
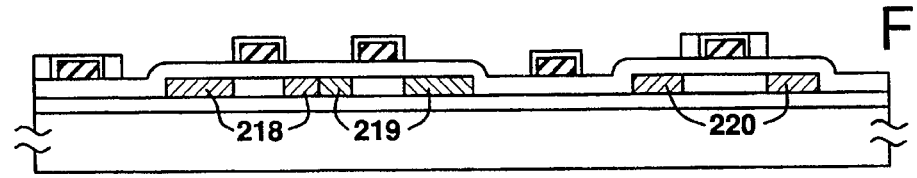

After removing the photoresist, voltages are applied to the series A2 and B2 in an electrolytic solution (ethylene glycol solution containing 3 to 10% of tartaric acid, boric acid, or nitric acid). The pH of the electrolytic solution is approximately 7. Thus, barrier type anodic oxides 213 to 217 is formed on the top and side surfaces of the gate electrode and of interconnects 206 to 210. The temperature of the solution is about 10° C. If the temperature is lower than room temperature, an oxide film having high quality can be obtained. The thickness of the anodic oxides 213 to 217 is in proportion to the applied voltage. When a voltage of 100 V is applied, an anodic oxide having a thickness of 1200 Å is formed. In the present invention, since a voltage is applied up to 100 V, the thickness of the anodic oxide is 1200 Å. If the barrier type anodic oxide is too thin, aluminum may be dissolved during etching of the porous anodic oxide. Therefore, the thickness of the barrier type anodic oxide is preferably 500 Å or more. The barrier type anodic oxide is formed not outside the porous anodic oxide in a later process but between the porous anodic oxide and the gate electrode and between the porous anodic oxide and the interconnect (FIG. 3C).

Using the gate electrode portion (comprising the gate electrodes and their surrounding anodic oxide film) and the gate-insulating film as masks, impurities are introduced into the regions 203 and 204 by a self-alignment. As a result, impurity regions (source/drain) 218, 219 and 220 are formed. Phosphine ($PH_3$) and diborane ($B_2H_6$) are used as dopant gases. The dose is $5\times10^{14}$ to $5\times10^{15}$ cm$^{-2}$. The accelerating energy is 50 to 90 keV. An N-type impurity is introduced into the regions 218 and 220. A P-type impurity is introduced into the region 219. Consequently, NTFT 228, PTFT 229 and NTFT 230 are formed by the regions 218, 219 and 220, respectively.

For the complementary TFTs 228 and 229, the thickness of the anodic oxides 214 and 215 in the side surfaces of the gate electrode is about 1200 Å. Regions (offset regions) in which the gate electrode does not overlap the impurity regions have widths of $x_1$ and $x_3$. Taking account of non-straight movement of ions during ion doping, the offset widths $x_1$ and $x_3$ are about 1000 Å. For the TFT 230, since the sum of the thicknesses of the anodic oxides 212 and 217 is about 6200 Å, the offset width $x_2$ is about 6000 Å.

Figure 3E:
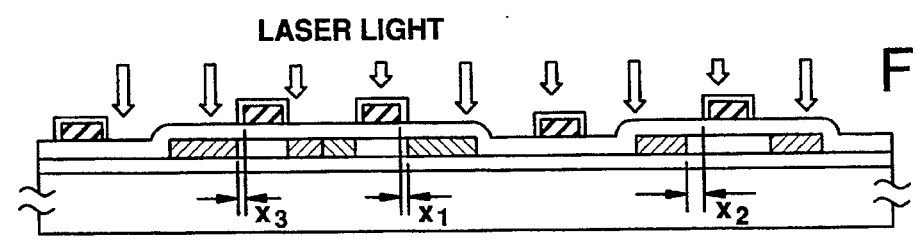
Figure 4C:
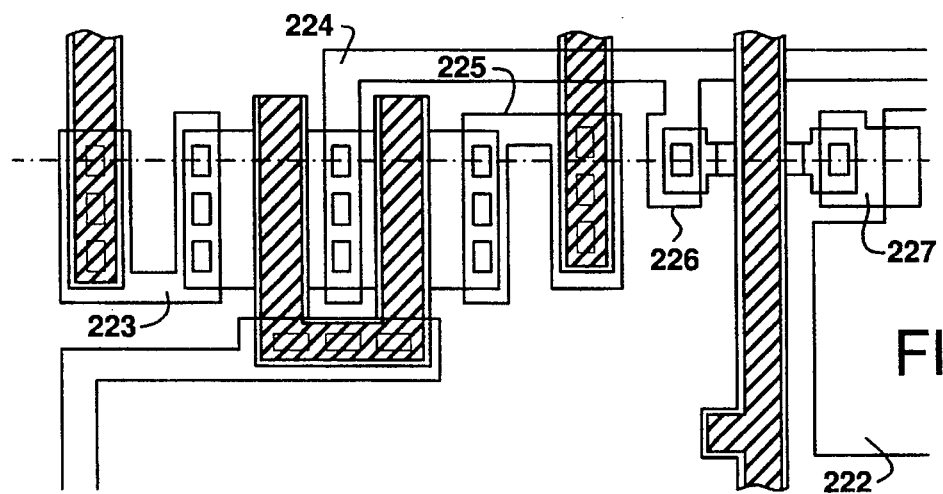

The anodic oxides 211 and 212 is etched at an etching rate of about 600 Å/min, using a mixed acid of phosphoric acid, acetic acid, and nitric acid. The anodic oxides 213 to 217 and the silicon oxide film 205 remain unetched. Then, a KrF excimer laser is irradiated to activate the impurities introduced in the active layer (FIG. 3E). The laser has a wavelength of 248 nm and a pulse width of 20 ns. The gate electrode and the interconnects are separated (FIG. 4C).

A silicon oxide film is formed as an interlayer insulator 221 at a thickness of 6000 Å. An ITO film having a thickness of 800 Å is formed by sputtering and patterned to form a pixel electrode 222. Thereafter, the interlayer insulator 221 and the gate insulating film 205 are etched to form contact holes in the sources and drains. At the same time, the interlayer insulator 221 and the anodic oxides 213 to 217 are etched to form contact holes in the gate electrodes and in the interconnects. Unlike in Example 1, the anodic oxide hardly differs in thickness between series A2 and B2. Therefore, they can be etched at the same time. Hence, this example has one fewer photolithography process compared with Example 1. After forming interconnects and electrodes 223 to 226, hydrogen annealing is carried out at 200° to 400° C.

Figure 3F:
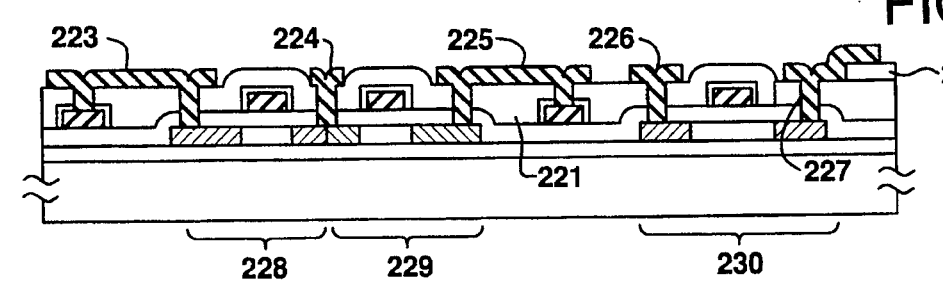

The interconnect 223 connects the interconnect 206 with the source of the complementary NTFT. The interconnect 225 connects the source of the complementary PTFT with the interconnect 209. The interconnects 224 and 226 connect the output terminals (the drains of the NTFT and PTFT) of the complementary TFT with the drain of the TFT 230. The interconnect 227 connects the drain of the TFT 230 with the pixel electrode 222. In this way, an integrated circuit is completed (FIG. 3F).

For the series A2, since the driver is operated by a large current, the PTFT and NTFT whose high resistance regions have widths of $x_1$ and $x_{41}$, respectively, are less deteriorated. Decoders, CPUs, shift registers, memories, and other circuits consume only small amounts of electric power and operate at high frequencies. Their channel widths and channel lengths are small. Deterioration due to hot carriers produces easily. It is necessary that the width $x_3$ of high resistance regions of NTFTs used in these circuits be larger than the width $x_1$ of the high resistance regions of PTFTs. Since the NTFTs (high resistance region width $x_2$) of an active matrix circuit to which a high voltage is applied are required to have small mobilities, these NTFTs are easily deteriorated. In order to improve the reliability, the following relations must be obtained: $x_2 > x_3 > x_4 \leq x_1$. For example, $x_2$ is 0.5 to 1 µm, $x_3$ is 0.2 to 0.3 µm, $x_4$ is 0 to 0.2 µm, and $x_1$ is 0 to 0.1 µm. Shift registers can operate at 1 to 50 MHz.

In the present example, the offset region of the TFT 230 for controlling a pixel electrode is sufficiently wider than the offset regions of TFTs in Example 1. In consequence, leakage current can be suppressed greatly.

EXAMPLE 3

FIGS. 5A to 5E show a monolithic active matrix liquid crystal display of the present example. Driver are composed of complementary TFTs. The active matrix circuit comprises TFTs for controlling pixels. A silicon oxide film is deposited as a base oxide film 302 having a thickness of 2000 Å on a substrate 301 in an oxygen atmosphere by sputtering or PCVD. The substrate is made of Corning 7059 and is 300×400 mm in size.

Then, an amorphous silicon film having a thickness of 300 to 5000 Å, preferably 500 to 1000 Å, is formed by PCVD or LPCVD. The laminated substrate is allowed to stand at 550° to 600° C. in a reducing atmosphere for 24 hours to crystallize the amorphous silicon film. The crystallized silicon film is patterned to form island regions 303 and 304. Furthermore, a silicon oxide film 305 having a thickness of 700 to 1500 Å is formed by sputtering.

An aluminum film having a thickness of 1000 Å to 3 µm, e.g., 6000 Å, is formed by sputtering. The aluminum film contains 0.1 to 0.3% of scandium (Sc) by weight. A photoresist film is formed on the aluminum film by spin coating in the same way as in Example 2 (FIGS. 3A to 3C). An aluminum oxide film having a thickness of 100 to 1000 Å is formed by anodization before the formation of the photoresist film. After patterning and etching the photoresist film and the aluminum film, gate electrodes 306, 307 and 308 and an interconnect 309 are formed. The gate electrodes 306, 307, and 308 are electrically independent of each other. The gate electrode 308 is electrically connected with the interconnect 309.

Anodization is effected by applying a voltage of 5 to 30 V (8 V in this example) for 20 to 140 minutes in an electrolytic solution, to form a porous anodic oxide having a thickness of 3000 Å to 25 µm. The electrolytic solution is 3 to 20% acidic aqueous of citric acid, oxalic acid, phosphoric acid, chromic acid or sulfuric acid, in this example, a solution of citric acid (30° C.). The thickness of the anodic oxide is adjusted by the anodization time. A thin anodic oxide having a thickness of 500 to 2000 Å, e.g., 1000 Å, is formed on the gate electrodes 306 and 307. A thick anodic oxide having a thickness of 3000 to 9000 Å, e.g., 5000 Å, is formed in the gate electrode 308 and the interconnect 309.

Figure 5A:
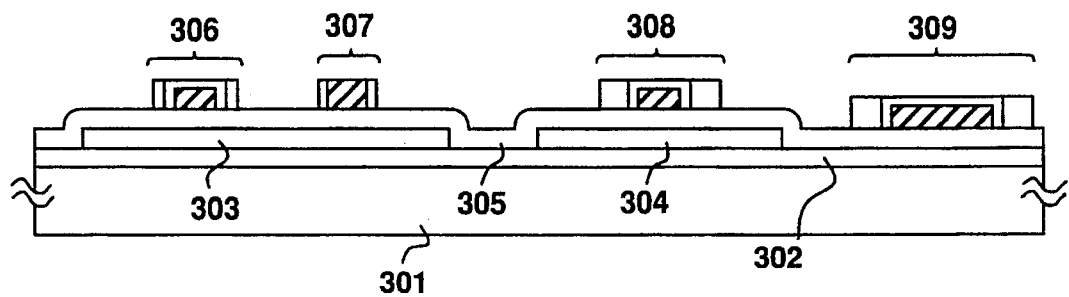
FIGS. 5A to 5E are cross-sectional views of a TFT circuit according to Example 3 of the present invention.

After removing the photoresist, the above voltage is applied to the gate electrodes and the interconnects (wirings) in an electrolytic solution (ethylene glycol solution containing 3 to 10% of tartaric acid, boric acid or nitric acid). The pH of the electrolytic solution is approximately 7. A barrier type anodic oxide having a thickness of 1000 Å is formed on the top and side surfaces of the gate electrodes and interconnects (FIG. 5A).

Figure 5B:
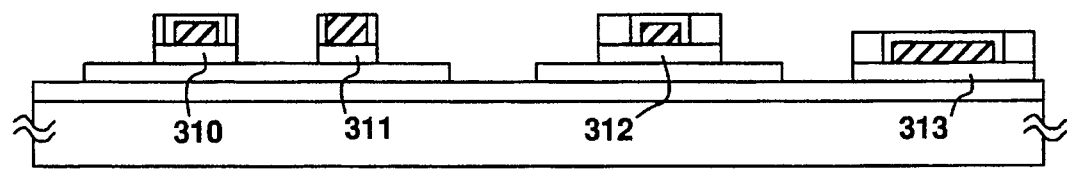

The silicon oxide film 305 is etched by dry etching such as plasma mode of isotropic etching or reactive ion etching mode of anisotropic etching. It is important that the selection ratio between silicon and silicon oxide be large enough to prevent the active layer from being etched deeply. If $CF_4$ is used as an etchant gas, the anodic oxide is not etched. Therefore, those portions of the silicon oxide film 305 which are located under the gate electrodes 306, 307 and 308 and the interconnect 309 are not etched and remain as gate insulating films 310, 311 and 312 and an insulating film 313 (FIG. 5B).

The porous anodic oxide is etched using a mixed acid of phosphoric acid, acetic acid and nitric acid. Using the gate electrode portion and the gate insulating film as masks, impurities are introduced into the regions 303 and 304 by a self-alignment in ion doping process. If the accelerating voltage is 50 to 90 kV and the dose is $1 \times 10^{13}$ to $5 \times 10^{14}$ $cm^{-2}$, most impurity ions pass through the regions 314 to 316. Since the impurity concentration is maximum in the base layer, the regions 314 to 316 are extremely lightly doped and have extremely low impurity concentration. On the other hand, since high speed impurity ions are decelerated by the presence of the gate insulating films 310 to 312, it is considered that the regions 317 to 319 have a maximum impurity concentration. However, since the dose is low, the regions 317 to 319 are lightly doped and have a low impurity concentration.

If the accelerating voltage is 5 to 30 kV and the dose is $5 \times 10^{14}$ to $5 \times 10^{15}$ $cm^{-2}$, since numerous impurity ions are introduced into the regions 314 to 316, the regions 314 to 316 are heavily doped and have a high impurity concentration. On the other hand, since the gate insulating films 310 to 312 hinder introduction of low speed impurity ions, the amount of ions introduced into the regions 317 to 319 is small. As a result, the regions 317 to 319 are lightly doped and have a low impurity concentration. In either method, the regions 317 to 319 are lightly doped.

Figure 5C:
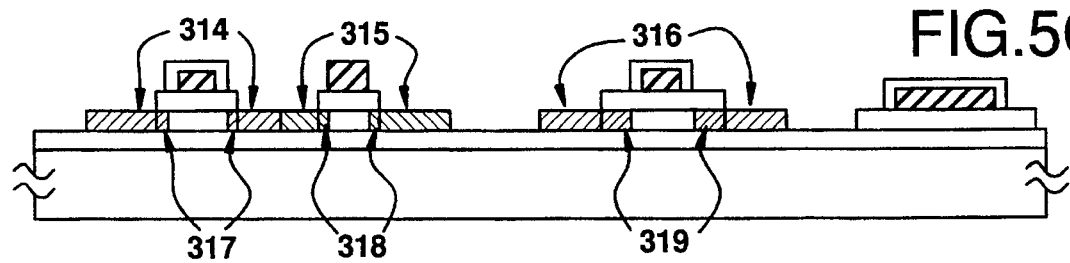

After the regions 317 to 319 are formed by ion doping, a KrF excimer laser having a wavelength of 248 nm and a pulse width of 20 ns is irradiated to activate the impurity ions introduced in the active layer. This process may also be carried out by RTP (rapid thermal process) (FIG. 5C).

As a result, the high resistance regions (lightly doped regions and offset regions) have different widths in each TFT. The width $x_1$ of the driver NTFTs is the sum of the offset region width of 1000 Å and the lightly doped region width of 1000 Å, i.e., 2000 Å. The width $x_2$ of the driver PTFTs is the width of only the lightly doped regions, i.e., 1000 Å. The width $x_3$ of the pixel control TFTs is the sum of the offset width 1000 Å and the lightly doped region width 5000 Å, i.e., 6000 Å.

Figure 5D:
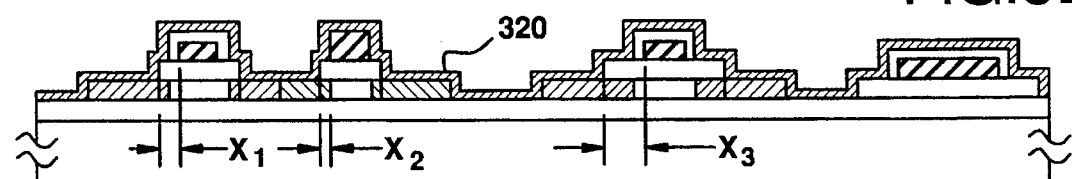

Furthermore, a film of a metal such as titanium, nickel, molybdenum, tungsten, platinum, or palladium is formed. For example, a titanium film 320 having a thickness of 50 to 500 Å°is formed by sputtering. As a result, the titanium film 320 is in contact with the regions 314 to 316 (FIG. 5D).

a KrF excimer laser having a wavelength of 248 nm and a pulse width of 20 ns is irradiated to react the titanium film with the silicon in the active layer, thus forming metal silicide (titanium silicide) regions 330 to 332. The energy density is 200 to 400 mJ/cm$^2$, preferably 250 to 300 mJ/cm2. If the substrate temperature is 200 to 500° C. during the laser irradiation, peeling of the titanium film can be suppressed. The laser is not limited to an excimer laser and other laser may also be used. If a continuous oscillated laser is employed, the irradiation time is long. As a result, the irradiated object may be thermally expanded and peeled off. For this reason, the use of a pulse laser is desired.

With respect to a pulse laser, an infrared laser such as Nd:YAG laser (preferably Q-switched pulse oscillation), visible light using the second harmonic of such an infrared laser, and various ultraviolet lasers such as excimer laser (e.g., KrF, XeCl, and ArF lasers) can be used. Where a laser is irradiated from above a metal film, it is necessary that the wavelength of the laser not be reflected by the metal film. Where the metal film is extremely thin, almost no problem occurs. Where laser is irradiated from the side of the substrate, it is necessary that the laser light be transmitted through the silicon film.

In addition, lamp annealing using visible light or near infrared light may also be used. Where lamp annealing is utilized, the temperature of the surface of the irradiated object is adjusted during about 600° to 1000° C. Where the temperature is 600° C., the lamp irradiation is required to be continued for several minutes. Where the temperature is 1000° C., the lamp irradiation is required to be continued for several ten seconds. Where annealing utilizing near infrared ray (e.g., infrared ray of 1.2 μm) is carried out, near infrared ray is selectively absorbed by the silicon semiconductor and does not heat the glass substrate so much. Furthermore, since each irradiation time is short, heating of the glass substrate can be suppressed.

Using an etching solution obtained by mixing hydrogen peroxide, ammonia and water in a ratio of 5:2:2, a titanium film (existing the gate insulating film and the anodic oxide) is etched except for those portions which are in contact with the exposed active layer. The titanium silicide regions 330 to 332 remain unetched. The sheet resistance of the regions 330 to 332 is 10 to 50 Ω/square, while that of the regions 317 to 319 are 10 to 100 kΩ/square.

A silicon nitride film 322 having a thickness of 500 to 3000 Å, e.g., 1000 Å, is formed on the NTFT 337. Since the silicon nitride film 322 tends to capture (trap) positive holes, this silicon nitride film 322 is effective in preventing charging of the gate insulating film normally caused by hot electrons produced by injection of hot carriers in TFTs of the active matrix circuit in which hot carriers are easily produced. In the case of PTFTs, a reverse effect is produced. It is better not to form a silicon nitride film on complementary circuits. For these reasons, the silicon nitride film remains only on the active matrix circuit.

A silicon oxide film is deposited as an interlayer insulator 321 at a thickness of 2000 Å to 1 μm, e.g., 5000 Å, by CVD. A hole 324 is formed in the interconnect 309 to expose the silicon nitride film 322. An ITO film is formed by sputtering and then patterned and etched to form a pixel electrode 323. The pixel electrode 323 sandwiches the barrier type anodic oxide (1000 Å in thickness) and the silicon nitride film (1000 Å in thickness) by using the interconnect 309 in the hole 324 to form an electrostatic capacitor. Since the anodic oxide and the silicon oxide film are thin and have large dielectric constants, a large capacitance can be obtained by a slight area. This capacitance is used as a retaining capacitance arranged in parallel to a capacitance formed by both one pixel of the active matrix circuit and an opposite electrode. The interconnect 309 is in the same potential as the opposite electrode.

Figure 5E:
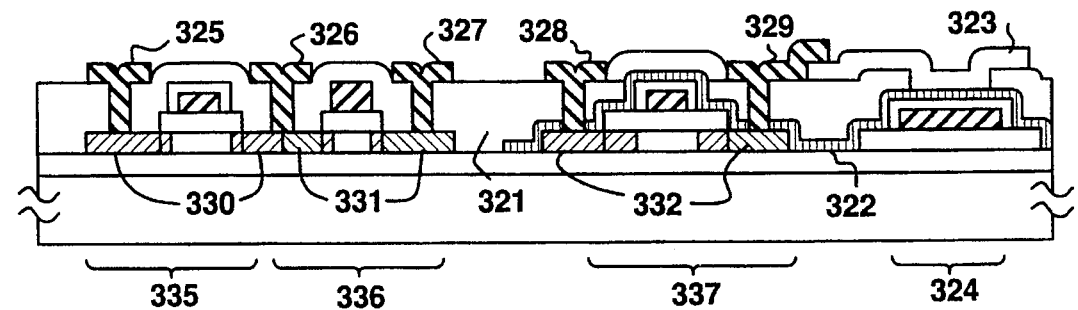

The interlayer insulator 321 is etched to form contact holes in the source/drain regions and in the gate electrodes. Multilayer interconnects (titanium nitride and aluminum) having a thickness of 2000 Å to 1 μm, e.g., 5000 Å, and electrodes 325 to 329 are formed (FIG. 5E).

The NTFT 337 forming the active matrix circuit, NTFTs for a decoder, a CPU, a memory, and other NTFTs operating at high frequencies and consuming only small amounts of electric power, and NTFTs and PTFTs for high power drivers have the same high resistance region width as used in Example 2. In a thin film integrated circuit having a monolithic electro-optical device, the widths of high resistance regions in the NTFTs and PTFTs can be optimized.

EXAMPLE 4

Figure 6:
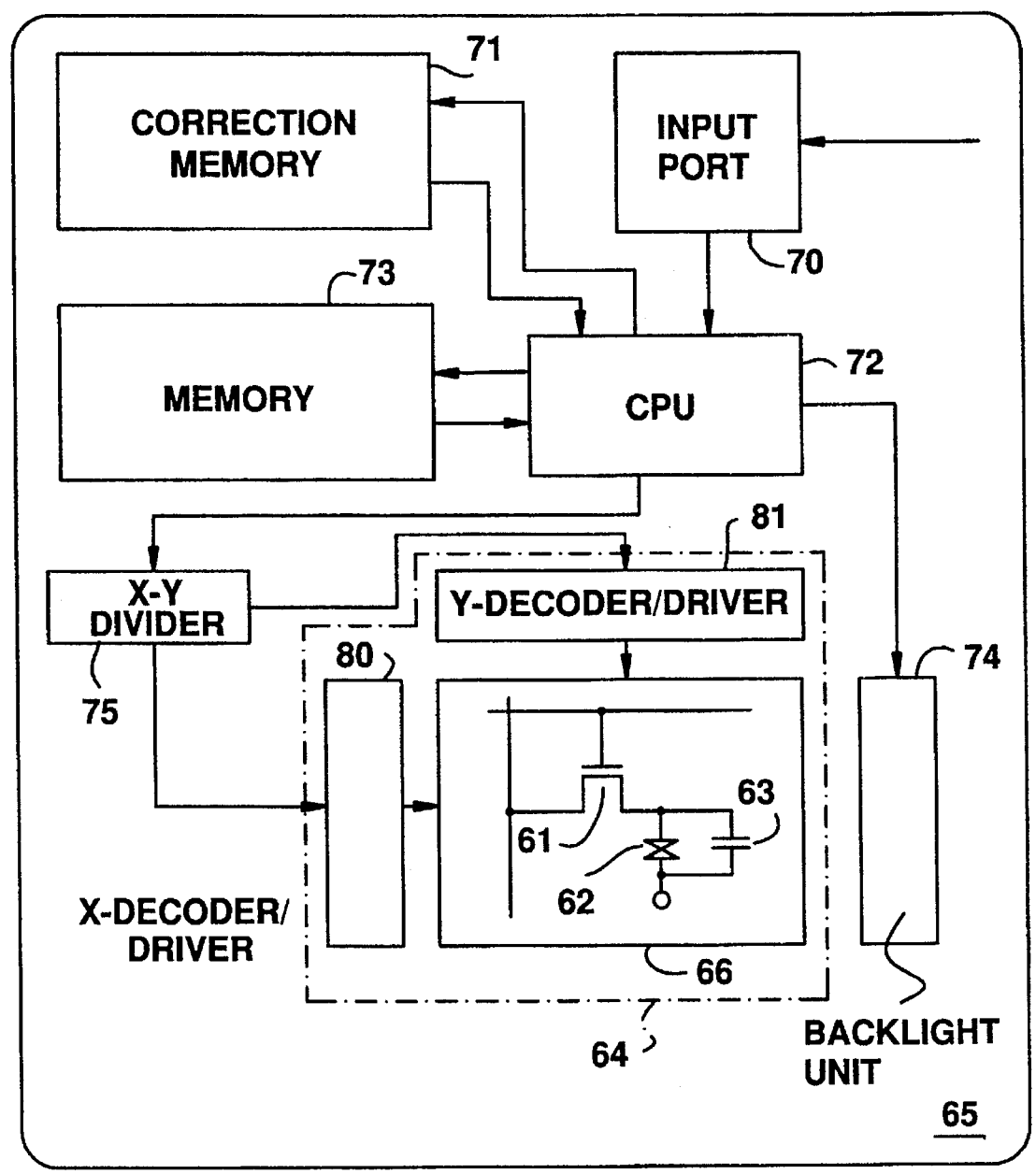
FIG. 6 is a block diagram of an integrated circuit according to the present invention.

FIG. 6 is a block diagram of an electro-optical system using an integrated circuit having a glass substrate on which a display, a CPU, a memory, and other components are formed. In Examples 1 to 3, only the active matrix circuit and X- and Y-decoders/drivers are described. A higher grade circuit and system can be constructed using the present example.

The electro-optical system 65 shown in FIG. 6 comprises a liquid crystal display portion 64, an input port 70, a correction memory 71, a CPU 72, a memory 73, a backlight unit 74, and an X-Y divider 75. The display portion 64 has an active matrix circuit 66, an X-decoder/driver 80, and a Y-decoder/driver 81. The active matrix circuit 66 comprises a TFT 61, a liquid crystal 62, and capacitor 63.

The input port 70 receives an input signal such as an image signal from an external device such a main computer system (not shown). The correction memory 71 is a nonvolatile memory and stores data used to correct the input signal according to the characteristics of the active matrix circuit 66. The memory 71 also stores information intrinsic to each pixel. Where some of the pixels of the active matrix circuit 64 have point defects, the CPU 72 reads corresponding correction data from the correction memory 71, based on the pixel located around the defective pixels, and outputs the correction data to the display portion 64 via the X-Y divider 75. In this way, the point defects are eliminated. If the defective pixels are darker than the surrounding pixels, the CPU 72 reads from the correcting memory 71 such brightness data as the brightness of the defective pixel coincides with the brightness of the surrounding pixels. The brightness data is then output to the display portion 64.

The CPU 72 and the memory 73 are designed similarly to a conventional computer system. The memory 73 stores image data corresponding to each pixel as a RAM. The CPU 72 also controls the backlight unit 74 which illuminates the active matrix circuit 66 from its rear surface according to the image information.

In order that each circuit have appropriate high resistance region widths, 3 to 10 systems of interconnects are formed. Channel lengths, channel widths, and high resistance widths may be modified by changing the anodization conditions. For example, in an active matrix circuit, the channel length is 10 µm, and the high resistance region width is 0.4 to 1 µm, e.g., 0.6 µm. In a driver NTFT, the channel length is 8 µm, the channel width is 200 µm, and the high resistance region width is 0.2 to 0.3 µm, e.g., 0.25 µm. In a driver PTFT, the channel length is 5 µm, the channel width is 500 µm, and the high resistance region width is 0 to 0.2 µm, e.g., 0.1 µm. In a decoder NTFT, the channel length is 8 µm, and channel width is 10 µm, and the high resistance region width is 0.3 to 0.4 µm, e.g., 0.35 µm. In a decoder PTFT, the channel length is 5 µm, the channel width is 10 µm, and the high resistance region width is 0 to 0.2 µm, e.g., 0.1 µm. The high resistance region widths of NTFTs and PTFTs forming the CPU, the input port, the correction memory, and other memories are optimized in the same way as in the low power consumption decoder operating at high frequencies. Therefore, the electro-optical system 65 can be fabricated on the same substrate having an insulating surface.

In the present invention, the high resistance region widths can be variously modified but the high resistance regions are not required to be made from the same material and have the same conductivity type as the channel forming region. A trace amount of N-type impurity is added to each NTFT. A trace amount of P-type impurity is added to each PTFT. Furthermore, carbon, oxygen, nitrogen or other material is selectively added to form high resistance regions. This is effective in eliminating the tradeoffs among deterioration due to hot carriers, reliability, frequency characteristics, and OFF current.

In this way, according to the present invention, TFTs provided with high resistance regions having optimum widths can be fabricated on the same substrate, depending on the required TFT characteristics and reliability. As a result, a larger scale integrated circuit can be fabricated with a great degree of freedom. Accordingly, the present invention can be applied to an ultrathin one board personal computer, a portable terminal, and so on. That is, TFTs are formed on a large area substrate. These TFTs are used for an active matrix circuit, drivers, a CPU, and memories to form an electro-optical system. Furthermore, this electro-optical system can be made intelligent and coupled with a CPU, a computer system, or an image processing system using other single crystal semiconductor.

What is claimed is:

1. A semiconductor integrated circuit comprising:

a substrate;

an active matrix circuit which is formed on the substrate and includes at least one thin film transistor having first offset region, a first anodic oxide and impurity regions; and driving means for driving the active matrix circuit which is formed on the substrate and includes at least another two thin film transistors each having second offset regions and a second anodic oxide, wherein a resistance of the first offset regions is larger than that of the second offset regions, a thickness of the first anodic oxide coincides with that of the second anodic oxide and the first anodic oxide is spaced apart from the impurity regions.

2. A semiconductor integrated circuit comprising:

a substrate;

at least one thin film transistor which is formed on the substrate and provided as an active matrix circuit, the one thin film transistor having first offset regions and a first anodic oxide; and at least another two thin film transistors which are formed on the substrate and provided as a driver circuit for driving the active matrix circuit, the another two thin film transistor each having second offset regions and a second anodic oxide, wherein a resistance of the first offset regions is larger than that of the second offset regions, and a thickness of the first anodic oxide coincides with that of the second anodic oxide.

3. The circuit of claim 2 wherein the one thin film transistor having the first offset regions is N-channel type.

4. The circuit of claim 2 wherein the another thin film transistor having the second offset regions is P-channel type.

5. A semiconductor device comprising:

a substrate having an insulating surface;

a plurality of semiconductor regions which are formed on the insulating surface and each have at least one active layer;

an insulating film covering the semiconductor regions;

a gate electrode formed on each active layer through the insulating film; and at least one anodic oxide formed on at least both sides of each gate electrode, wherein a thickness of one anodic oxide formed on one gate electrode is different from that of another anodic oxide formed on another gate electrode, wherein at least one thin film transistor having the one gate electrode is provided as an active matrix circuit and at lest another one thin film transistor having the another gate electrode is provided as a driver circuit for driving the active matrix circuit.

6. The device of claim 5 wherein one active layer formed under the one gate electrode has first offset regions, another active layer formed under the another gate electrode has second offset regions, and a width of the first offset regions is different from that of the second offset regions.

7. The device of claim 5 wherein each active layer includes a source region and a drain region.

8. The device of claim 5 wherein crystallinity of one semiconductor region is different from that of another semiconductor region.

9. The device of claim 5 wherein at least two gate electrodes are electricity insulated each other.

10. A semiconductor integrated circuit comprising:

substrate;

an active matrix circuit which is formed on the substrate and includes at least a first thin film transistor having first lightly doped drain regions, first off, set regions and a first anodic oxide; and driving means for driving the active matrix circuit which is formed on the substrate and includes at least second and third thin film transistors, the second thin film transistor having second lightly doped drain regions, second offset regions and a second anodic oxide, the third thin film transistor having third lightly doped drain regions, wherein a resistance of the first lightly doped drain regions is larger than that of the second and third lightly doped drain regions, a resistance of the first offset regions coincides with that of the second offset regions and a thickness of the first anodic oxide coincides with that of the second anodic oxide.

11. A thin film transistor comprising:

substrate having an insulating surface;

an active layer, formed on the insulating surface, including high concentration impurity regions and a channel forming region formed therebetween;

an insulating film formed on the active layer; and a gate electrode formed on active layer through the insulating film, wherein the active layer further includes low concentration regions formed between one of the high concentration impurity region and one side of the channel forming region and between another high concentration impurity region and the other side of the channel forming region, and wherein both sides of the insulating film coincide with one side of each of the low concentration impurity regions which is in contact with each of the high concentration impurity regions.

12. A semiconductor integrated circuit comprising:

a substrate having an insulating surface; and a plurality of thin film transistors formed on the insulating surface at least one thin film transistor being provided as an active matrix circuit, at least another one thin film transistor being provided as a driving circuit for driving the active matrix circuit, wherein each thin film transistor comprises, an active layer, formed on the insulating surface, including high concentration impurity regions, a channel forming region formed therebetween and low concentration regions formed between one of the high concentration impurity region and one side of the channel forming region and between another high concentration impurity region and another side of the channel forming region, an insulating film formed on the active layer, and a gate electrode formed on active layer through the insulating film, wherein both sides of the insulating film coincide with one side of each of the low concentration impurity regions which is in contact with each of the high concentration impurity regions and a width of the low concentration impurity regions of one thin film transistor is different from that of the low concentration regions of another thin film transistor.

13. A semiconductor device comprising:

a substrate having an insulating surface; and at least one thin film transistor which is formed on the insulating surface and provided as an active matrix circuit and at least another two thin film transistors which are formed on the insulating surface and provided as a driver circuit for driving the active matrix circuit, wherein the one thin film transistor has a first anodic oxide, first offset regions and impurity regions and the another two thin film transistor each have second anodic oxide and second offset regions, wherein a width of the first offset regions is larger than that of the second offset regions, wherein a thickness of the first anodic oxide coincides with that of the second anodic oxide, and wherein the first anodic oxide is spaced apart from the impurity regions.

14. A semiconductor integrated circuit comprising:

a substrate;

an active matrix circuit which is formed on the substrate and includes at least one thin film transistor having first offset regions and a first anodic oxide; and driving means for driving the active matrix circuit which is formed on the substrate and includes at least another two thin film transistors each having second offset regions and a second anodic oxide, wherein a width of the first offset regions is larger than that of the second offset regions, and wherein a thickness of the first anodic oxide coincides with that of the second anodic oxide.

15. A semiconductor integrated circuit comprising:

a substrate;

an active matrix circuit which is formed on the substrate and includes at least a first thin film transistor having first lightly doped drain regions, first offset regions and a first anodic oxide; and driving means for driving the active matrix circuit which is formed on the substrate and includes at least second and third thin film transistors, the second thin film transistor having second lightly doped drain regions, second offset region and a second anodic oxide, the third thin film transistor having third lightly doped drain regions, wherein a width of the first lightly doped drain regions is larger than that of the second and third lightly doped drain regions, a width of the first offset regions coincides with that of the second offset regions and a thickness of the first anodic oxide coincides with that of the second anodic oxide.

16. A semiconductor integrated circuit comprising:

a substrate;

at least a first thin film transistor which is formed on the substrate and provided as an active matrix circuit, the first thin film transistor having first lightly doped drain regions, first offset regions and a first anodic oxide; and at least another second and third thin film transistors which are formed on the substrate and provided as a driver circuit for the active matrix circuit, the second thin film transistor having second lightly doped drain regions, second offset regions and a second anodic oxide, the third thin film transistor having third lightly doped drain regions, wherein a width of the first lightly doped drain regions is larger than that of the second lightly doped drain regions, a width of the first offset regions coincides with that of the second offset regions and a thickness of the first anodic oxide coincides with that of the second anodic oxide.

17. A semiconductor integrated circuit comprising:

a substrate having an insulating surface; and a plurality of thin film transistors formed on the insulating surface, wherein each thin film transistor comprises, an active layer, formed on the insulating surface, including impurity regions, a channel region formed therebetween and high resistance regions formed between one of the impurity regions and one side of the channel region and between another impurity region and the other side of the channel region, an insulating film formed on the active layer, and a gate electrode formed on active layer through the insulating film, wherein a width of the high resistance regions of one thin film transistor is different from that of the high resistance regions of another thin film transistor.

* * * * *